US009666516B2

(12) United States Patent
Smith et al.

(10) Patent No.: US 9,666,516 B2
(45) Date of Patent: May 30, 2017

(54) ELECTRONIC PACKAGES AND METHODS OF MAKING AND USING THE SAME

(71) Applicant: General Electric Company, Schenectady, NY (US)

(72) Inventors: Scott Smith, Niskayuna, NY (US); Christopher James Kapusta, Delanson, NY (US); Glenn Alan Forman, Niskayuna, NY (US); Eric Patrick Davis, Niskayuna, NY (US)

(73) Assignee: GENERAL ELECTRIC COMPANY, Niskayuna, NY (US)

( * ) Notice: Subject to any disclaimer, the term of this patent is extended or adjusted under 35 U.S.C. 154(b) by 0 days.

(21) Appl. No.: 14/556,258

(22) Filed: Dec. 1, 2014

(65) Prior Publication Data

US 2016/0155693 A1    Jun. 2, 2016

(51) Int. Cl.
*H01L 23/00* (2006.01)
*H01L 23/498* (2006.01)
(Continued)

(52) U.S. Cl.
CPC .... *H01L 23/49827* (2013.01); *H01L 21/2885* (2013.01); *H01L 21/486* (2013.01);
(Continued)

(58) Field of Classification Search
CPC ......... H01L 23/00; H01L 23/48; H01L 33/50; H01L 33/62; H01L 23/49827;
(Continued)

(56) References Cited

U.S. PATENT DOCUMENTS 5,366,929 A    11/1994    Cleeves et al.
6,100,200 A    8/2000    Van Buskirk et al.
(Continued)

FOREIGN PATENT DOCUMENTS

JP    05198624 A    8/1993
JP    2008016539 A    1/2008
(Continued)

OTHER PUBLICATIONS

Jun Fei et al., "Self-aligned via and trench for metal contact in III-V semiconductor devices", Journal of Vacuum Science & Technology B: Microelectronics and Nanometer Structures, IEEE Xplore, vol. 24, Issue: 3, Abstract—2 Pages, May 2006.
(Continued)

*Primary Examiner* — Chuong A Luu
(74) *Attorney, Agent, or Firm* — John P. Darling

(57) ABSTRACT

An electronic package and a method of making the same in provided. The electronic package includes a dielectric layer and a conformal masking layer disposed on at least a portion of the dielectric layer. The electronic package further includes a routing layer disposed on at least a portion of the masking layer and a micro-via disposed at least in part in the conformal masking layer and the routing layer. Further, at least a portion of the routing layer forms a conformal electrically conductive layer in at least a portion of the micro-via. Also, the conformal masking layer is configured to define a size of the micro-via. The electronic package further includes a semiconductor die operatively coupled to the micro-via.

13 Claims, 5 Drawing Sheets

(51) Int. Cl.
*H01L 25/065* (2006.01)
*H01L 21/48* (2006.01)
*H01L 21/288* (2006.01)
*H01L 21/66* (2006.01)

(52) U.S. Cl.
CPC .............. *H01L 24/24* (2013.01); *H01L 24/82* (2013.01); *H01L 24/83* (2013.01); *H01L 24/97* (2013.01); *H01L 25/0655* (2013.01); *H01L 22/12* (2013.01); *H01L 22/14* (2013.01); *H01L 22/22* (2013.01); *H01L 23/49838* (2013.01); *H01L 24/29* (2013.01); *H01L 2224/0401* (2013.01); *H01L 2224/04042* (2013.01); *H01L 2224/04105* (2013.01); *H01L 2224/12105* (2013.01); *H01L 2224/16227* (2013.01); *H01L 2224/2919* (2013.01); *H01L 2224/32225* (2013.01); *H01L 2224/82031* (2013.01); *H01L 2224/82039* (2013.01); *H01L 2224/82047* (2013.01); *H01L 2224/82106* (2013.01); *H01L 2224/82138* (2013.01); *H01L 2224/8314* (2013.01); *H01L 2224/83129* (2013.01); *H01L 2224/83192* (2013.01); *H01L 2224/92144* (2013.01); *H01L 2224/97* (2013.01); *H01L 2225/1035* (2013.01); *H01L 2225/1058* (2013.01); *H01L 2924/01022* (2013.01); *H01L 2924/01024* (2013.01); *H01L 2924/01028* (2013.01); *H01L 2924/01073* (2013.01); *H01L 2924/01074* (2013.01); *H01L 2924/01079* (2013.01); *H01L 2924/14* (2013.01); *H01L 2924/1433* (2013.01); *H01L 2924/15724* (2013.01); *H01L 2924/15738* (2013.01); *H01L 2924/15747* (2013.01); *H01L 2924/15763* (2013.01); *H01L 2924/3025* (2013.01)

(58) Field of Classification Search
CPC ......... H01L 23/49838; H01L 23/49866; H01L 2924/01022; H01L 2924/01028; H01L 2924/01074; H01L 2924/01079; H01L 2924/01024; H01L 2924/01073; H01L 2924/15724; H01L 2924/15747; H01L 2924/15763; H01L 2924/15738
USPC .......................................... 257/98, 774, 741
See application file for complete search history.

(56) References Cited

U.S. PATENT DOCUMENTS

| | | | |
|---|---|---|---|
| 6,506,633 B1 * | 1/2003 | Cheng | .................... H01L 24/24 257/E21.705 |
| 6,638,851 B2 | 10/2003 | Cowley et al. | |
| 7,341,938 B2 | 3/2008 | Enquist | |
| 8,114,712 B1 | 2/2012 | McConnelee et al. | |
| 8,586,474 B2 | 11/2013 | Chatterjee et al. | |
| 8,653,670 B2 | 2/2014 | McConnelee et al. | |
| 9,117,813 B2 | 8/2015 | McConnelee et al. | |
| 2006/0211240 A1 | 9/2006 | Chi et al. | |
| 2009/0291296 A1 | 11/2009 | McConnelee et al. | |
| 2011/0316167 A1* | 12/2011 | McConnelee | ....... H01L 23/5389 257/774 |
| 2012/0161325 A1* | 6/2012 | McConnelee | ......... H01L 21/486 257/760 |
| 2015/0069435 A1* | 3/2015 | Chen | ..................... H01L 33/56 257/98 |

FOREIGN PATENT DOCUMENTS

| | | |
|---|---|---|
| JP | 2014003292 A | 1/2014 |
| WO | 0209149 A2 | 1/2002 |

OTHER PUBLICATIONS

European Search Report and Opinion issued in connection with corresponding EP Application No. 15195705.7 on May 3, 2016.
Office Action issued in connection with corresponding JP Application No. 2015-227213 on Feb. 14, 2017.

* cited by examiner

ELECTRONIC PACKAGES AND METHODS OF MAKING AND USING THE SAME

This invention was made with Government support under grant number FA9453-09-C-0305 awarded by the Air Force Research Laboratories. The Government has certain rights in the invention.

BACKGROUND

Embodiments of the present specification relate to electronic packages, and more particularly, forming micro-vias and interconnects in the electronic packages.

Technological advancements in the area of electronic devices have experienced vast growth in recent years. For example, while cellular phones are becoming smaller and lighter, their features and capabilities are simultaneously expanding. This has caused an increase in the complexity and operation of the electrical components found in such devices and a decrease in the amount of space available for such components. Several challenges arise from such an increase in the complexity of the electrical components and decrease in the amount of space available. For example, based on space limitations, circuit boards are reduced in size to an extent that the routing density for the board may be constrained and limited below a desired amount. As integrated circuits become increasingly smaller and yield better operating performance, packaging technology for integrated circuit (IC) packaging has correspondingly evolved from leaded packaging to laminate-based ball grid array (BGA) packaging and eventually to chip scale packaging (CSP). Advancements in IC chip packaging technology are driven by ever-increasing needs for achieving better performance, greater miniaturization, and higher reliability. New packaging technology has to further provide for the possibilities of batch production for the purpose of large-scale manufacturing thereby allowing economy of scale.

Furthermore, due to the small size and complexity of IC packages, the process for fabricating the IC packages is typically expensive and time consuming. Also, use of additional re-distribution layers to create desired double-sided input/output (I/O) system increases the number of processing steps, further increasing the cost and complexity of the manufacturing process. Moreover, increasing I/O per device increases routing density and number of vias that are required per device.

BRIEF DESCRIPTION

In accordance with aspects of the present specification, an electronic package is presented. The electronic package includes a dielectric layer and a conformal masking layer disposed on at least a portion of the dielectric layer. The electronic package further includes a routing layer disposed on at least a portion of the conformal masking layer and a micro-via disposed at least in part in the conformal masking layer and the routing layer. Further, at least a portion of the routing layer forms a conformal electrically conductive layer in at least a portion of the micro-via. Also, the conformal masking layer is configured to define a size of the micro-via. The electronic package further includes a semiconductor die operatively coupled to the micro-via.

In accordance with another aspect of the present specification, an electronic system having an electronic package is presented. The electronic package includes a dielectric layer, a conformal masking layer disposed on at least a portion of the dielectric layer, and a routing layer disposed on at least a portion of the conformal masking layer. Further, the electronic package includes a plurality of micro-vias disposed at least in part in the conformal masking layer and the routing layer. Moreover, at least a portion of the routing layer forms a conformal electrically conductive layer in at least a portion of micro-vias of the plurality of micro-vias. The electronic system further includes a plurality of semiconductor dies, where one or more semiconductor dies of the plurality of semiconductor dies are coupled to corresponding micro-vias of the plurality of micro-vias.

In accordance with yet another aspect of the present specification, a method of making an electronic package is included. The method includes providing a dielectric layer disposed on a processing frame, where the dielectric layer includes a first side and a second side. Further, the method includes providing a conformal masking layer disposed on the second side of the dielectric layer, where the conformal masking layer includes one or more patterns corresponding to one or more micro-vias. Moreover, the method includes coupling a semiconductor die to a portion of the first side of the dielectric layer such that the semiconductor die is aligned with the one or more patterns. Also, the method includes selectively removing portions of the dielectric layer corresponding to the one or more patterns in the conformal masking layer. In addition, the method includes disposing a conformal electrically conductive layer in at least a portion of one or more patterns corresponding to the one or more micro-vias to form the one or more micro-vias, where the conformal masking layer is configured to define a size of the one or more micro-vias. Moreover, the method includes selectively removing portions of the dielectric layer to form the one or more micro-vias.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
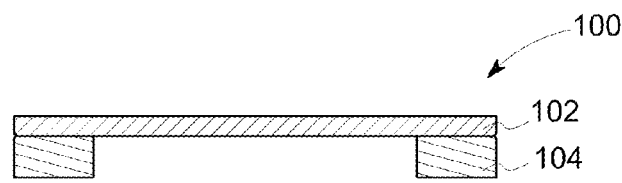
FIGS. 1-9 are schematic representations of steps involved in an exemplary method of making an electronic package having a micro-via, in accordance with aspects of the present specification.

Embodiments of the present specification relate to electronic packages having conformal masking layers and methods of making the same. In certain embodiments, at least a portion of a conformal masking layer of an electronic package conforms to at least a portion of one or more micro-vias present in the electronic package. Further, the conformal masking layer may be made of an electrically conductive material and configured to form a part of an electronic circuit or a thermal pathway in the electronic package. Once the conformal masking layer defines the via size the conformal masking layer may be integrated into the electronic package to form other structures. By way of example, the conformal masking layer may be configured to act as a ground plane, power source, signal source, shield layer, or combinations thereof. In instances where the conformal masking layer is configured to act as the shield layer, the conformal masking layer may be configured to provide a localized shield against at least a portion of radio frequency and/or electromagnetic radiation.

In certain embodiments, the electronic package may be used to couple one or more semiconductor devices (such as semiconductor dies) to one or more electronic components. In one example, the electronic package may be easily coupled to a printed circuit board (PCB) for providing electrical connection between the printed circuit board and other electronic components. In one embodiment, the electronic package may be used to provide high density electrical connections by virtue of small size and pitch of the micro-vias. In certain embodiments, an average diameter of the micro-vias may be in a range from about 5 microns to about 50 microns. In certain other embodiments, an average diameter of the micro-vias may be in a range from about 5 microns to about 25 microns, or from about 10 microns to about 50 microns. Further, in some embodiments, an average pitch between two adjacently disposed micro-vias may be in a range from about 10 microns to about 100 microns. Further, in one embodiment, the micro-vias may be through micro-vias or blind micro-vias. As used herein, the term "through micro-vias" is used to refer to micro-vias that go through a layer and do not have a bottom end. Moreover, as used herein, the term "blind micro-vias" is used to refer to micro-vias that have a bottom end that is in electrical contact with an adjacently disposed or underlying layer or an integrated circuit (IC) pad. In one embodiment, the micro-vias may not have any wall or layer disposed between a corresponding pad of the semiconductor device and the micro-vias. In some embodiments, the micro-vias may be arranged in a linear arrangement, an array, or any other geometrical or non-geometrical arrangement. In certain embodiments, an electronic package employing the micro-vias may be compatible with conventional die bonding techniques, such as, but not limited to, wire bonding, flip-chip technology, and other methods of connecting electronic input/output (I/O) pads of a semiconductor die to the electronic package.

FIGS. 1-9 are schematic diagrams showing steps of a method of making an electronic package having a conformal masking layer, in accordance with aspects of the present specification. FIG. 1 is the schematic representation 100 of a dielectric or dielectric layer 102 of a high density electronic package (not shown in FIG. 1) disposed on a processing frame 104. Further, in some embodiments, the dielectric layer 102 may be made of a polymeric material that is flexible. In one embodiment, the dielectric layer 102 may be formed of a dielectric material, such as, but not limited to, polyimide or polyimide-based materials. In a particular example, the dielectric layer 102 may be made of Kapton®. In certain embodiments, the dielectric layer 102 may have a thickness of about 25 microns, for example. Further, the processing frame 104 may be made of an electrically conductive material, such as aluminum, copper, ceramic-metal composite, nickel, silver, stainless steel, or other suitable materials, or combinations thereof. In one example, the processing frame 104 may be made of Kovar®.

Also, the processing frame 104 may or may not form part of the resultant circuit or electronic package.

Figure 2:
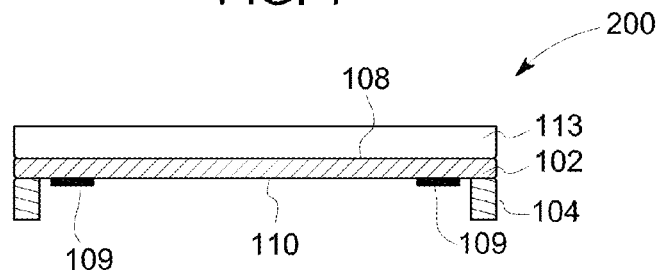

Optionally, as illustrated in the schematic representation 200 of FIG. 2, a layer (not shown) of an adhesive material may be applied on at least a portion of a first side 108 of the dielectric layer 102. Also, a ground layer 109 may be disposed on a second side 110 of the dielectric layer 102. The ground layer 109 may be made of an electrically conductive layer. In a non-limiting example, the ground layer 109 may be made of copper. Further, the ground layer 109 may be a patterned layer. Moreover, in some embodiments, another layer of the same or different adhesive may be applied on the ground layer 109 and/or exposed portions of the second side 110 of the dielectric layer 102. In one example, the adhesive layer may be made of an electrically non-conductive epoxy. It may be noted that the ground layer 109 may be disposed before or after forming the conformal masking layer on the dielectric layer 102.

Additionally, a conformal masking layer 112 (see FIG. 4) may be disposed on the first side 108 of the dielectric layer 102. Alternatively, in instances where the adhesive layer is disposed on the dielectric layer 102, the conformal masking layer 112 may be disposed on the adhesive layer. Further, the conformal masking layer 112 may be disposed on the adhesive layer after curing of the adhesive layer. The description hereinafter refers to instances where the conformal masking layer 112 is disposed directly on the dielectric layer 102. In certain embodiments, the conformal masking layer 112 may be disposed on the dielectric layer 102 by first disposing a layer 113 of a material of the conformal masking layer 112 on at least a portion of the dielectric layer 102. Subsequently, the layer 113 of the material of the conformal masking layer 112 may be processed to form the conformal masking layer 112. In one example, the layer 113 may be patterned to selectively remove portions of the layer 113 to form the conformal masking layer 112. Further, patterns may be formed in the layer 113 using techniques, such as, but not limited to, lithography, etching, such as laser etching, or both. Although not illustrated, it may be noted that the conformal masking layer 112 may be disposed on both first and second sides 108 and 110 of the dielectric layer 102. In certain embodiments, the layer 113 of the material of the conformal masking layer 112 may be deposited on the portion of the dielectric layer 102 by employing techniques, such as, but not limited to, coating, electroplating, sputtering, spraying, metallization, vapor deposition, pasting, dip coating, or combinations thereof. Non-limiting examples of the material of the conformal masking layer 112 may include one or more electrically conductive materials, such as, but not limited to, copper, silver, aluminum, nickel, chrome, titanium, tantalum, or combinations thereof.

Figure 3:
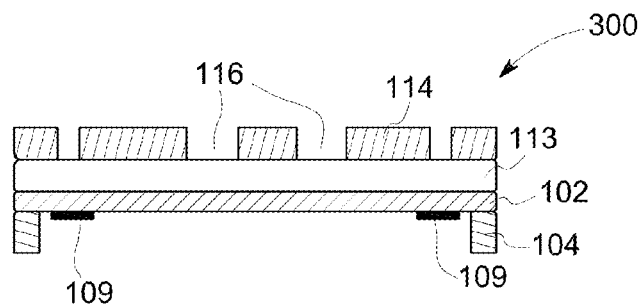

Referring now to the schematic representation 300 of FIG. 3, the layer 113 may be transformed to the conformal masking layer 112 (see FIG. 4) by patterning the layer 113 to form at least a portion of micro-vias 122 (see FIG. 9) in the layer 113 and the dielectric layer 102. To form the patterns corresponding to the micro-vias 122 in the layer 113, a resist layer 114 having patterns 116 may be provided. In one embodiment, the resist layer 114 may be provided on the layer 113 by placing the resist layer 114 on the layer 113, where the resist layer 114 contains the patterns 116. Further, the resist layer 114 may be deposited using known deposition techniques, such as spraying, painting, physical vapor deposition, chemical vapor deposition, sputtering, dip coating, or the like. Moreover, the resist layer 114 may include the patterns 116 such that the patterns 116 are similar to the patterns of micro-vias that are intended to be formed in the layer 113 and the dielectric layer 102. In particular, the patterns 116 in the resist layer 114 may correspond to locations and size of the micro-vias 122 that are desirable in a resultant electronic package such as the electronic package 900 (see FIG. 9). In one embodiment, the resist layer 114 may be configured to act as a photoresist mask during photolithography to translate the patterns 116 of the resist layer 114 to the layer 113.

Figure 4:
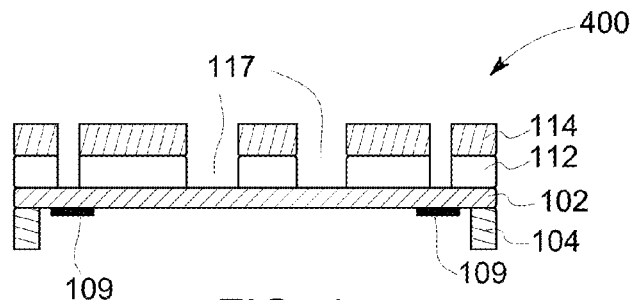
Figure 5:
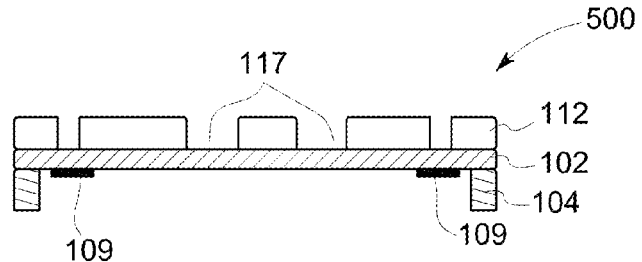

Next, as illustrated in the schematic representation 400 of FIG. 4, the layer 113 may be patterned with the aid of the resist layer 114, using etching. Accordingly, at least a portion of the layer 113 corresponding to the patterns 116 of the resist layer 114 may be selectively removed to form patterns 117 in the layer 113. This layer 113 having the patterns 117 is referred to as the conformal masking layer 112. Further, the patterns 117 constitute a portion of the micro-vias that are formed in the conformal masking layer 112 and the dielectric layer 102. Moreover, as illustrated in the schematic representation 500 of FIG. 5, after forming the patterns 117 in the layer 113, the resist layer 114 may be removed. In one example, the resist layer 114 may be removed by dry or wet etching.

Figure 6:
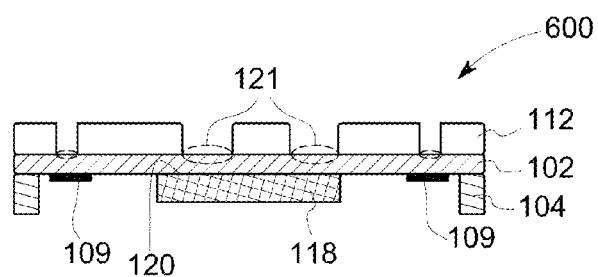

Additionally, as illustrated in the schematic representation 600 of FIG. 6, a semiconductor die 118 having a plurality of contact nodes or pads (not shown) attached or contained within an active surface 120 of the semiconductor die 118 may be coupled or attached to the second side 110 of the dielectric layer 102. In particular, the semiconductor die 118 may be attached to the portion of the dielectric layer 102 that has the patterns 117. By way of example, as illustrated in FIG. 6, the semiconductor die 118 is aligned to the patterns 117 formed in the conformal masking layer 112. In some embodiments, the semiconductor die 118 may be coupled to the dielectric layer 102 using an adhesive layer disposed between the semiconductor die 118 and the dielectric layer 102.

While FIGS. 6-9 illustrate the semiconductor die 118 as being coupled to the dielectric layer 102, it is envisioned that other electronic components other than the semiconductor die 118, such as active or passive electronic devices, may also be attached to the dielectric layer 102 and/a portion of the ground layer 109. Further, although FIGS. 6-9 are explained with respect to a single die, however, the method of the present specification may be extended to couple a plurality of dies, including an array of dies, where one or more dies of the array of dies may be coupled to respective micro-vias in an electronic package. Accordingly, although not illustrated, it is contemplated that a plurality of such electronic components may be attached to the dielectric layer 102 such that a multi-component module or layer may be formed. Further, in embodiments where a plurality of dies is employed, contact pads of the dies may be aligned to the patterns 117, which are representative of positions of future micro-via locations, for electrical connection between the micro-vias and the semiconductor dies.

It may be appreciated that as the cost and complexity of semiconductor dies, such as application specific integrated circuit chips (ASICs), increases, there is a corresponding increase in the cost of designing, qualifying and fabricating packaging for these devices. Advantageously, the method of the present specification allows the provision for the patterns 117 in the conformal masking layer 112 to be formed before coupling the semiconductor die 118 to the dielectric layer 102. Accordingly, the method facilitates testing of defective or damaged patterns 117 and/or other pre-patterned routing interconnect in the dielectric layer 102. In one embodiment, the patterns 117 may be tested using visual inspection or automated methods using automatic test equipment and probing devices, as well known to those skilled in the art. In one example, the patterns 117 may be tested by inspecting the conformal masking layer 112 and a routing layer 136 (see FIG. 9). In some embodiments, once the defective or damaged micro-via patterns 117 are identified, the identified defective or damaged patterns 117 micro-via may be exempt from being coupled with the semiconductor dies, such as the semiconductor die 118, thereby saving the expensive semiconductor dies from becoming inoperable due to virtue of them being connected to a faulty micro-via.

Figure 7:
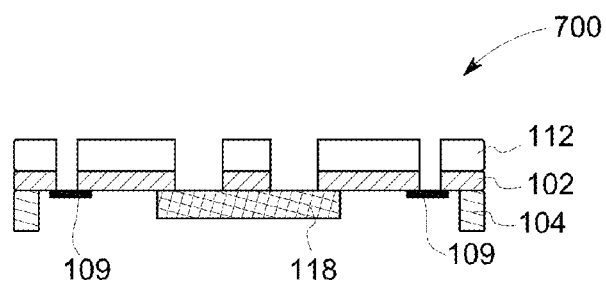

Further, as illustrated in the schematic representation of FIG. 7, after coupling the semiconductor die 118 to the second side 110 of the dielectric layer 102, selected portions 121 (see FIG. 6) of the dielectric layer 102 may be removed. In particular, the selected portions 121 may be removed to extend the patterns 117 and form the micro-vias 122 (see FIG. 8). In one embodiment, the portions 121 of the dielectric layer 102 may be removed using dry etching, wet etching, ablation, dissolving, drilling, laser ablation, or combinations thereof. Further, it may be noted that along with the selected portions 121 of the dielectric layer 102 adhesive layers on one or both sides 108 and 110 of the dielectric layer may be removed.

In case of laser ablation of the dielectric layer 102, patterning beams (not shown in FIG. 7) may be used to remove determined portions of the dielectric layer 102 and adhesive layer (not shown) to form patterns in the dielectric layer 102 that correspond to the patterns 117 (see FIG. 5) formed in the conformal masking layer 112. Further, in case of the laser ablation, portions 121 of the dielectric layer 102 may be removed using patterning beams. It may be noted that conformal masking layer 112 is configured to define a size of the micro-vias. In particular, the size of the micro-vias may be defined by the patterns 117 formed in the conformal masking layer 112. In one embodiment, the patterning beams may include laser beams. In an exemplary embodiment, a size of the patterning beams may be greater than or equal to a size of the micro-vias that are to be formed in the dielectric layer 102. In embodiments where the size of the patterning beams is larger than the size of the micro-vias 122, presence of the conformal masking layer 112 allows only a portion of the patterning beams corresponding to the desirable size of the micro-vias 122 (see FIG. 8) to be incident on the dielectric layer 102. Further, once patterns 121 that correspond to the patterns 117 in the layer 112 are formed the laser ablation may be stopped at the semiconductor die 118 or the adhesive layer disposed between the dielectric layer 102 and the semiconductor die 118 (or at the ground layer 109). In one embodiment, a thickness of the layer 113 of the material of the conformal masking layer may be such that the layer 113 is configured to withstand energy of the patterning beams without undergoing undesirable disintegration. In certain embodiments, the micro-vias 122 may be blind micro-vias that are configured to provide electrical connections between the semiconductor die 118 and an electronic component, such as a chip, where the semiconductor die 118 and the chip are coupled using the electronic package 900 (see FIG. 9). It may be noted that the methods of the present specification enable forming micro-vias, such as the micro-vias 122, which are relatively smaller in size than vias that are typically formed using laser patterning. In particular, the size of the micro-vias 122 may be even smaller than the size of the patterning beams that are used to form the micro-vias 122. Advantageously, the smaller size of the micro-vias 122 is enabled because the material of the conformal masking layer 112 is configured to block at least a portion of the patterning beams, thereby preventing the removal of portions of the dielectric layer 102 disposed under the material of the conformal masking layer 112. Consequently, the size of the micro-vias 122 is determined by the size of the patterns 117 present in the conformal masking layer 112, and not by the size of the patterning beams or laser beams that are used to form selectively remove material of the dielectric layer 102.

Figure 8:
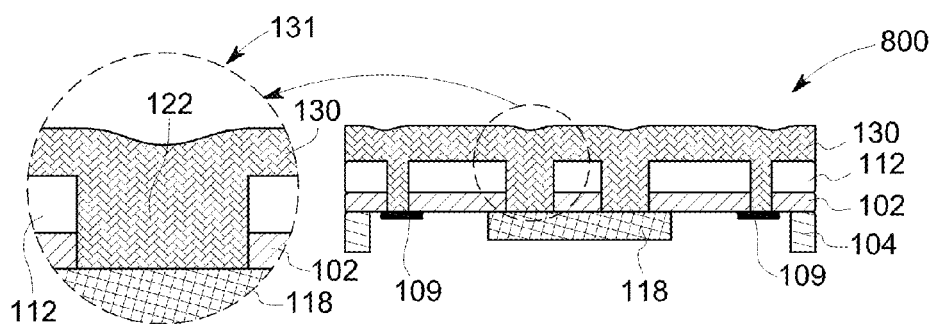

Also, as illustrated in the schematic representation 800 of FIG. 8, a conformal electrically conductive layer 130 may be deposited on at least a portion of the conformal masking layer 112 as well as at least in the micro-vias 122. The conformal electrically conductive layer 130 may be disposed in the micro-vias 122 in a conformal manner. Reference numeral 131 refers to an enlarged view of a portion of the electronic package 900 (see FIG. 9) to more clearly depict the conformal nature of the conformal electrically conductive layer 130 at least in the micro-vias 122. The micro-vias 122 having the conformal electrically conductive layer 130 are referred to as micro-vias 122. Further, the conformal electrically conductive layer 130 provides electrical communication between the micro-vias 122 and the semiconductor die 118. The conformal electrically conductive layer 130 may include an electrically and thermally conductive material, and according to an exemplary embodiment, may be formed of a metallic material such as copper, silver, or nickel. Further, in one embodiment, the conformal electrically conductive layer 130 may include a single layer or a combination of layers. Moreover, it is also envisioned that composite materials may be used to form the conformal electrically conductive layer 130. In some embodiments, a metal impregnated epoxy or metal-filled paint, may be used as the conformal electrically conductive layer. In some other embodiments, the conformal electrically conductive layer 130 may be deposited using sputtering, electroplating, electro-less plating, or combinations thereof.

Optionally, in some embodiments, before depositing the conformal electrically conductive layer 130, an additional electrical connection layer may be deposited on portions of the semiconductor die 118 corresponding to the micro-vias 122. Non-limiting examples of the material for the conformal electrically conductive layer 130 may include titanium, titanium-tungsten, chromium, or combinations thereof. Further, in same or different embodiments, in addition to the conformal electrically conductive layer 130, additional layers may be deposited as required.

Figure 9:
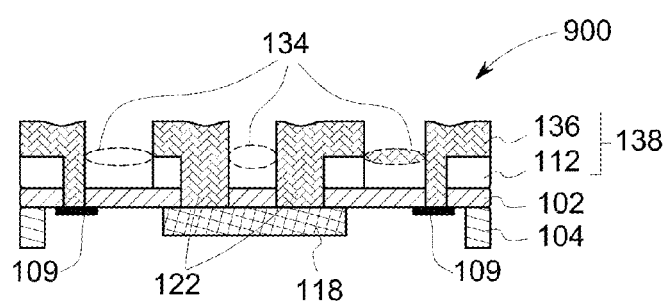

FIG. 9 is a schematic representation of an electronic package 900. As illustrated in FIG. 9, selected portions, for example, portions at locations 134 of the conformal electrically conductive layer 130 may be removed to form a routing layer 136 on at least a portion of the conformal masking layer 112. Furthermore, corresponding portions in the adjacently disposed conformal masking layer 112 may also be removed to isolate traces for routing. The routing layer 136 thus formed may include traces that connect micro-vias 122 to other components in the electronic package 900 or the semiconductor die 118 and/or the chip (not shown in FIG. 9). The conformal masking layer 112 and the routing layer 136 together provide electrical connections between components of the chip and/or the electronic package 900. It may be noted that the routing layer 136 provides electrical connection between the micro-vias 112 and the conformal masking layer 112. The conformal masking layer 112 and the routing layer 136 together form a routing interconnect 138 for the electronic package 900. Further, the routing layer 136 may be formed of one or more of titanium, copper, nickel, gold, chrome, aluminum, titanium-tungsten, or combinations thereof.

Further, one or more cleaning steps may be introduced after any step that entails removing at least a portion of one or more layers of the electronic package 900. By way of example, a cleaning step may be performed after the step represented by FIG. 3, where portions of the layer 113 of the material of the conformal masking layer 112 (see FIGS. 6-9) are removed. Similarly, a cleaning step or etch step may be performed at least after the steps represented in FIGS. 4, 5, 7 and 9 are performed. Such cleaning steps may be performed to remove any excess material from a stack of layers that are configured to form the electronic package 900. It may be noted that additional cleaning steps may also be performed. By way of example, a cleaning step may be performed to clean at least a portion of a surface of the conformal masking layer 112 disposed inside the micro-vias 122, outside the micro-vias 122, or both, prior to depositing the conformal electrically conductive layer 130. In some embodiments, an optional step of cleaning the conformal masking layer 112 may be employed before disposing the conformal electrically conductive layer 130. In one example, the cleaning step may be used to remove any undesirable material, such as oxides, metals, dielectrics, adhesives to be removed from the surface of the conformal masking layer 112, thereby facilitating enhanced adherence between the conformal masking layer 112 and the conformal electrically conductive layer 130.

In certain embodiments, the electronic package 900 (see FIG. 9) may be mounted on an electronic board, for example, a printed circuit board (PCB) using wire bonding, ball grid array, flip-chip assembly, or any other known coupling techniques, or combinations thereof. By way of example, for low-cost, simple bonding with relatively larger contact pad size and lower input/output (I/O) density in the electronic package 900, wire bonding may be employed. Further, electronic pads on the electronic package 900 may be coupled to corresponding electrical traces or electronic pads on the electronic board using an electrically conductive wire to form the wire bond.

In another example, for low-cost, relatively high I/O density in the semiconductor die 118 or the electronic package 900, flip-chip technology may be used to electrically couple the electronic package 900 to the electronic board. Further, in some embodiments, metal bumps, studs, or balls of metals (collectively referred to herein as "bump-type" interconnections) may be applied, for example, in a two dimensional (2D) array pattern, directly to an active surface of the electronic package 900. Alternatively, in one embodiment, an electrically conductive adhesive may be used to couple the electronic package 900 to an electronic circuit.

Figure 10:
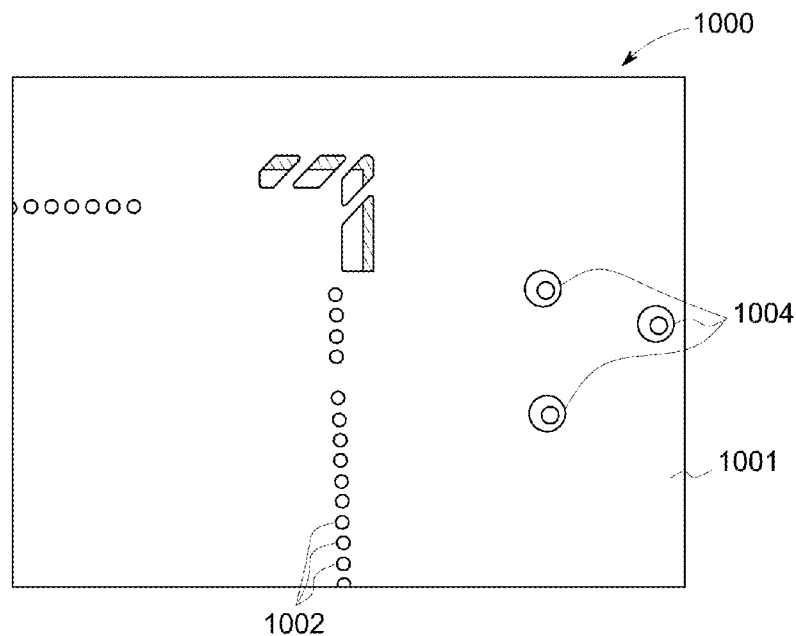
FIG. 10 is a top view of micro-vias employed in an electronic package, where the micro-vias are fabricated using the method represented in FIGS. 1-9, in accordance with aspects of the present specification.

Turning now to FIG. 10, a top view of a portion 1000 of an electronic package of the present specification is illustrated. The portion 1000 includes a conformal masking layer 1001 and micro-vias 1002 that are defined in the conformal masking layer 1001 of the present specification. The micro-vias 1002 may be formed using the method illustrated described with respect to FIGS. 1-9. Further, reference numeral 1004 represents conventional micro-vias formed using conventional methods. As illustrated, the micro-vias 1002 are smaller and densely packed in comparison to the conventional vias 1004 that are larger and spaced farther apart from one another. Accordingly, the micro-vias 1002 of the present specification are configured to be coupled to smaller sized dies having a higher density of contact pads.

Figure 11:
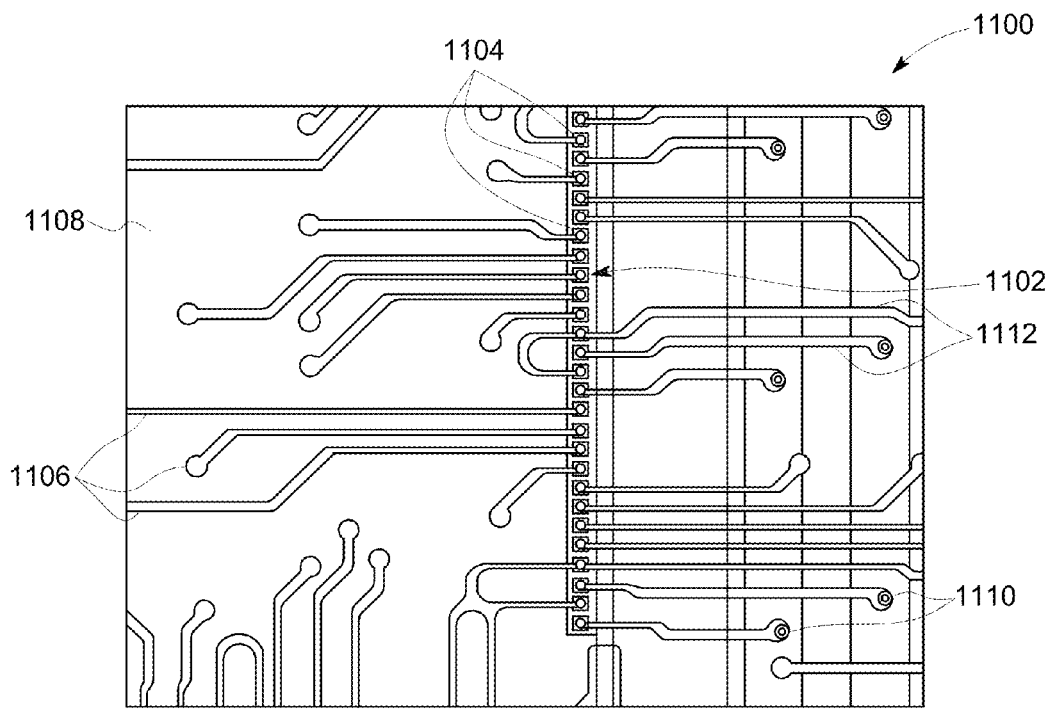
FIG. 11 is a top view of electrical routing in the electronic package of FIG. 10, in accordance with aspects of the present specification.

FIG. 11 is a top view of a portion of an electronic package 1100 of the present specification. In the illustrated embodiment, the portion 1100 illustrates an array 1102 of micro-vias 1104. Further, some of the micro-vias 1104 of the array 1102 may be electrically coupled to other electronic components within or outside the electronic package 1100 using electrical traces 1106 present in a routing layer 1108 of the electronic package 1100. By way of example, the micro-vias 1104 may be electrically coupled to an external electrical device, such as a semiconductor die, using the electrical traces 1106. Also, some other micro-vias 1104 may be coupled to other vias 1110, contact pads, or other routing layers on the dielectric layer of the electronic package using electrical traces 1112. Also, the electrical traces 1112 may be used as an electrical interconnect between the external devices to one another or a lower ground plane layer (not shown). These electrical traces 1106 and/or 1112 may be formed in the routing layer 1108 by selectively removing portions of the conformal electrically conductive layer 130 and the conformal masking layer 112, as described with respect to FIGS. 1-9.

In some embodiments, the electronic package of the present specification serves the purpose of providing an electrical interface between one or more electrical components and a board level circuit component, such as, but not limited to, solder pads on a printed circuit board, contact pads, a socket, or as well known to those of ordinary skill in the art. In a non-limiting example, the one or more electrical components may include one or more semiconductor chip dies, also referred to as "dies." Further, the board level circuit component may include a socket or a pad on a printed circuit board. Moreover, the electronic component is configured to provide both a first plurality of electrical connections to the semiconductor die and a second plurality of electrical connections adapted for connection to the board level circuit component.

In certain embodiments, the electronic package of the present specification may have a plurality of levels. In one example, the plurality of levels may include one or more conformal masking layers and/or one or more routing layers and dielectric layers. The layers of the plurality of levels may be used to selectively direct signals to and from contact pads of the semiconductor die and/or contact pads or electrical traces of the electronic package.

Figure 12:
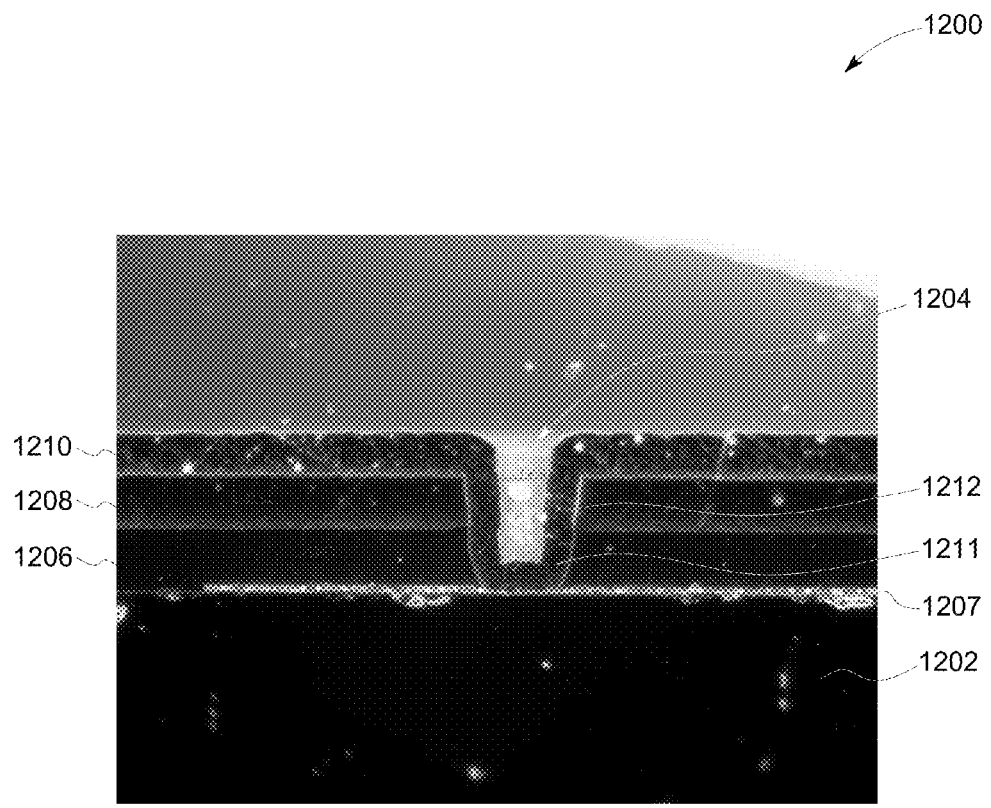
FIG. 12 is a cross-sectional view of a portion of an exemplary electronic package having a micro-via, in accordance with aspects of the present specification.

Referring to the schematic representation of FIG. 12, a portion of an electronic package 1200 is operatively coupled to a semiconductor die 1202 using semiconductor die pads 1207. The electronic package 1200 includes a micro-via 1204. Further, the micro-via 1204 includes a well-shaped structure 1212 defined by walls 1211. Moreover, the walls 1211 of the micro-via 1204 extend through an adhesive layer 1206, a dielectric layer 1208 and a combination of a conformal mask layer and a routing interconnect, both represented in a combined fashion by reference numeral 1210. The conformal layer on the walls 1211 of the micro-vias 1210 may be operatively coupled to the semiconductor die 1202. It may be noted that the conformal layer on the walls 1211 may be disposed in the entire volume present between the walls 1211. Alternatively, the conformal layer may be disposed in only a portion of the volume defined between the walls 1211 and the semiconductor die 1202.

Further, it may be noted that the method of making the high density electronic package is illustrated and described with respect to a single die. However, the method may also be used for making an electronic package with a plurality of dies. In one embodiment, the plurality of dies may be arranged in an array configuration. Further, the plurality of dies may be aligned relative to the positions of the micro-vias using a pick and place robotic device and one or more fiducial reference points. Further, in some embodiments, the method may also be used for making a plurality of electronic packages per processing frame. In these embodiments, each electronic package may have one or more semiconductor dies.

Figure 13:
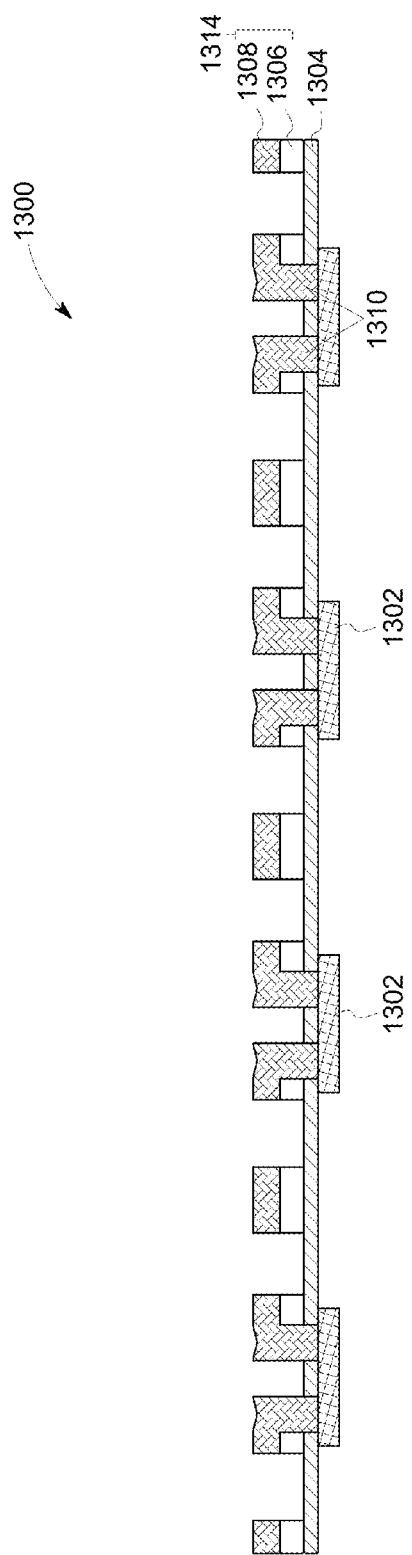
FIG. 13 is a cross-sectional view of a portion of an electronic system having a plurality of dies, in accordance with aspects of the present specification.

FIG. 13 represents an exemplary electronic package 1300 having a plurality of semiconductor dies 1302 coupled to a dielectric layer 1304. Further, the electronic package 1300 includes a conformal masking layer 1306 and a routing layer 1308. Also, the conformal masking layer 1306 and the routing layer 1308 together form a routing interconnect 1314 for the electronic package 1300. Moreover, a plurality of micro-vias 1310 is disposed in at least a portion of the conformal masking layer 1306 and the routing layer 1308. Portions of the routing layer 1308 form an electrically conductive layer in the plurality of micro-vias 1310 to provide electrical connection between the micro-vias 1310 and the plurality of semiconductor dies 1302. Further, the plurality of semiconductor dies 1302 may be arranged on the dielectric layer 1304 such that electrical connections, such as contact pads, on each of the semiconductor dies 1302 are aligned with corresponding micro-vias 1310 of the plurality of micro-vias 1310. Moreover, although not illustrated, some of the micro-vias 1310 of the plurality of micro-vias 1310 may be exempted from being coupled to the semiconductor dies 1302 or any other electrical devices. By way of example, upon inspection if it is determined that certain micro-vias 1310 are defective, the defective micro-vias 134 may not be coupled to the semiconductor dies 1302. Further, in the illustrated embodiment, the electronic package 1300 may be formed on a common processing frame (not shown). However, in some other embodiments, the electronic package 1300 may include a plurality of such processing frames. Further, in these embodiments, each of the plurality of processing frames may include one or more semiconductor dies. It may be noted that a stacked structure comprising a plurality of electronic packages, such as electronic package 900, electronic package 1300, or the like, and methods of making the same are envisioned within the scope of the present specification.

Advantageously, the electronic package of the present specification is configured to provide routing between at least one or more electrical components while accommodating space limitations, reduced pitches and increased routing density. By way of example, having micro-vias that have an average diameter in a range from about 5 microns to about 50 microns and pitch in a range from about 10 microns to about 100 microns, enables operatively coupling smaller circuit boards that may require higher routing density.

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

The invention claimed is:

1. An electronic package, comprising:
   a dielectric layer;
   a conformal masking layer disposed on at least a portion of the dielectric layer, wherein the conformal masking layer comprises an electrically conductive material;
   a routing layer disposed on at least a portion of the conformal masking layer, wherein the routing layer comprises a plurality of electrical traces;

a micro-via disposed at least in part in the conformal masking layer, the dielectric layer, and the routing layer, wherein at least a portion of the routing layer forms a conformal electrically conductive layer in at least a portion of the micro-via, and wherein the conformal masking layer is configured to define a size of the micro-via;

a semiconductor die coupled to the micro-via, wherein at least a portion of the conformal masking layer is disposed between the micro-via and a contact pad of the semiconductor die, wherein the routing layer provides an electrical connection between the micro-via and the conformal masking layer, and wherein the conformal masking layer and the routing layer together form a routing interconnect for the electronic package; and other vias electrically coupled to the micro-via using one or more of the plurality of electrical traces of the routing layer.

2. The electronic package of claim 1, wherein the conformal masking layer is configured to form a part of an electronic circuit or a thermal pathway in the electronic package.

3. The electronic package of claim 1, wherein the electrically conductive material includes, copper, titanium, aluminum, nickel, gold, tungsten chrome tantalum, or combinations thereof.

4. The electronic package of claim 1, wherein the conformal electrically conductive layer is disposed in the micro-via in a conformal manner.

5. The electronic package of claim 1, wherein the micro-via is a blind micro-via, wherein a bottom end of the blind micro-via comprises a portion of the conformal masking layer such that the portion of the conformal masking layer is in electrical contact with the contact pad of the semiconductor die.

6. The electronic package of claim 1, wherein a diameter of the micro-via is in a range from about 5 microns to about 50 microns.

7. The electronic package of claim 1, wherein the routing layer is configured to be deposited on the conformal masking layer.

8. The electronic package of claim 1, wherein the routing layer comprises titanium, copper, nickel, gold, chrome, aluminum, titanium-tungsten, or combinations thereof.

9. An electronic system, comprising:
an electronic package, comprising:
a dielectric layer;
a conformal masking layer disposed on at least a portion of the dielectric layer, wherein the conformal masking layer comprises an electrically conductive material;
a routing layer disposed on at least a portion of the conformal masking layer, wherein the routing layer comprises a plurality of electrical traces;
a plurality of micro-vias disposed at least in part in the conformal masking layer, the dielectric layer, and the routing layer, wherein at least a portion of the routing layer forms a conformal electrically conductive layer in at least a portion of micro-vias of the plurality of micro-vias;
a plurality of semiconductor dies, wherein one or more semiconductor dies of the plurality of semiconductor dies are coupled to corresponding micro-vias of the plurality of micro-vias, wherein at least a portion of the conformal masking layer is disposed between a micro-via of the plurality of micro-vias and a contact pad of a corresponding semiconductor die of the plurality of semiconductor dies,
wherein the routing layer provides electrical connections between the micro-vias and the conformal masking layer, and wherein the conformal masking layer and the routing layer together form a routing interconnect for the electronic package; and
other vias electrically coupled to one or more of the plurality of micro-vias using one or more of the plurality of electrical traces of the routing layer.

10. The electronic system of claim 9, wherein the plurality of micro-vias comprises blind micro-vias, wherein a bottom end of one or more blind micro-vias comprises a portion of the conformal masking layer such that the portion of the conformal masking layer is in electrical contact with a contact pad of a semiconductor die of the plurality of semiconductor dies.

11. The electronic system of claim 9, wherein one or more micro-vias of the plurality of micro-vias are electrically coupled to contact pads, other routing layers, or both using the routing interconnect.

12. The electronic system of claim 9, wherein an average diameter of the plurality of micro-vias is in a range from about 5 microns to about 100 microns.

13. The electronic package of claim 1, wherein the micro-via includes a well-shaped structure defined by walls, wherein at least a portion of the conformal masking layer is disposed on the walls of the micro-via.

* * * * *